(12) United States Patent
Okada et al.

(10) Patent No.: US 7,267,893 B2
(45) Date of Patent: Sep. 11, 2007

(54) OPTICAL MULTILAYER FILM AND OPTICAL SEMICONDUCTOR DEVICE INCLUDING THE SAME

(75) Inventors: Nobumasa Okada, Yamanashi (JP); Tadahiro Hiraike, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 188 days.

(21) Appl. No.: 10/648,356

(22) Filed: Aug. 27, 2003

(65) Prior Publication Data

US 2004/0043259 A1    Mar. 4, 2004

(30) Foreign Application Priority Data

Aug. 30, 2002    (JP)    ............... 2002-255056

(51) Int. Cl.
*B32B 7/12* (2006.01)
*B32B 15/04* (2006.01)

(52) U.S. Cl. .................. 428/696; 428/702; 428/701; 428/446

(58) Field of Classification Search ................ 428/221, 428/332–336, 446, 450, 457, 469, 688, 693; 359/321, 580, 582, 584, 586, 588; 372/10–12, 372/29.02, 43; 427/452–454, 471

See application file for complete search history.

(56) References Cited

U.S. PATENT DOCUMENTS

| | | | | |
|---|---|---|---|---|
| 5,777,792 A | * | 7/1998 | Okada et al. | ............... 359/584 |
| 5,912,504 A | * | 6/1999 | Yoshizawa et al. | ......... 257/730 |
| 6,222,967 B1 | * | 4/2001 | Amano et al. | ................ 385/49 |
| 2001/0031365 A1 | * | 10/2001 | Anderson et al. | ........... 428/432 |

FOREIGN PATENT DOCUMENTS

| | | |
|---|---|---|
| JP | 7-113901 | 5/1995 |
| JP | 2001-42169 | 2/2001 |

* cited by examiner

*Primary Examiner*—Jennifer McNeil
*Assistant Examiner*—Jonathan Langman
(74) *Attorney, Agent, or Firm*—Kratz, Quintos & Hanson, LLP

(57) ABSTRACT

An optical multilayer film includes: a first layer; a second layer that contains titanium oxynitride as a main component; and a third layer that contains magnesium fluoride as a main component; the first layer that has a different refractive index from that of the second layer or the third layer; and the first layer, the second layer, and the third layer being part of a laminated structure that includes a plurality of reflection planes. The thickness of the third layer is smaller than ¼ wavelength.

9 Claims, 6 Drawing Sheets

CHARACTERISTIC OF OPTICAL SEMICONDUCTOR DEVICE
HAVING OPTICAL MULTILAYER FILM THAT CAUSES STRESS

CHARACTERISTIC OF OPTICAL SEMICONDUCTOR DEVICE
HAVING OPTICAL MULTILAYER FILM THAT
DOES NOT CAUSES STRESS

CHARACTERISTIC OF OPTICAL SEMICONDUCTOR
DEVICE OF 1ST EMBODIMENT OF THE INVENTION

CRACKS

OPTICAL MULTILAYER FILM AND OPTICAL SEMICONDUCTOR DEVICE INCLUDING THE SAME

BACKGROUND OF THE INVENTION

1. Field of the Invention

The present invention generally relates to an optical multilayer film and an optical semiconductor device including the optical multilayer film.

2. Description of the Related Art

Conventionally, optical semiconductor devices such as semiconductor lasers and optical modulators have been developed in the form of metal or ceramic packages that are sealed to secure the airtightness of the inside of each device. However, those packages are costly and the sealing procedures are complicated, resulting in difficulty of providing inexpensive products.

To solve this problem, a method of sealing an optical semiconductor device with resin or the like has been recently suggested. By this method, however, the refractive index of the material that covers the optical semiconductor device as an optical element is changed after the sealing is performed with resin or the like. As a result, the optical semiconductor device cannot exhibit desired optical characteristics.

Japanese Unexamined Patent Publication No. 2001-42169 discloses a technique that solves the above problems. In this prior art, a semiconductor device having a single-layer reflection preventing film is sealed with resin, and light reflected by the boundary plane between the reflection preventing film and the resin is damped (or cancelled) by light that propagates in the reflection preventing film. In this manner, deterioration in the optical characteristics of the optical semiconductor device can be restrained.

Meanwhile, it has been widely known that an optical film such as a reflection preventing film is formed by a multilayer film to obtain a higher transmission rate. Japanese Unexamined Patent Publication No. 7-113901 discloses such a structure. In this prior art, however, there are no disclosures concerning a technique to improve and stabilize the optical characteristics of an optical semiconductor device.

SUMMARY OF THE INVENTION

It is therefore an object of the present invention to provide an optical multilayer film and an optical semiconductor device in which the above disadvantage is eliminated.

A more specific object of the present invention is to provide an optical multilayer film that can stabilize optical characteristics, and an optical semiconductor device that includes the optical multilayer film.

The above objects of the present invention are achieved by an optical multilayer film comprising: a first layer; a second layer that contains titanium oxynitride as a main component; and a third layer that contains magnesium fluoride as a main component; the first layer that has a different refractive index from that of the second layer or the third layer; and the first layer, the second layer, and the third layer being part of a laminated structure that includes a plurality of reflection planes, the thickness of the third layer being smaller than ¼ wavelength. Throughout the disclosure of the invention, it is to be understood that the reference to ¼ wavelength is referring to the wavelength of light passing through the optical multi layer film such as light incident on a light incident plane or of light emitting from a light emitting plane.

The above objects of the present invention are also achieved by an optical semiconductor device comprising an optical multilayer film that is located on an light incident plane or a light emitting plane, the optical multilayer film having a laminated structure that at least includes a first layer, a second layer containing titanium oxynitride as a main component, and a third layer containing magnesium fluoride as a main component, the first layer having a different refractive index from that of the second layer or the third layer, the laminated structure having a plurality of reflection planes, the thickness of the third layer being smaller than ¼ wavelength.

The above objects of the present invention are also achieved by an optical semiconductor device comprising an optical multilayer film that includes a plurality of layers having different refractive indices on a light incident plane or a light emitting plane, the optical multilayer film being able to exhibit first optical characteristics that are obtained by causing a refractive index difference between an outermost layer and the air or an inert gas, and second optical characteristics that are obtained by not causing a refractive index difference between the outermost layer and a material existing on the external side of the outermost layer, and the first optical characteristics and the second optical characteristics being substantially the same.

BRIEF DESCRIPTION OF THE DRAWINGS

Other objects, features and advantages of the present invention will become more apparent from the following detailed description when read in conjunction with the accompanying drawings, in which.

Figure 1:
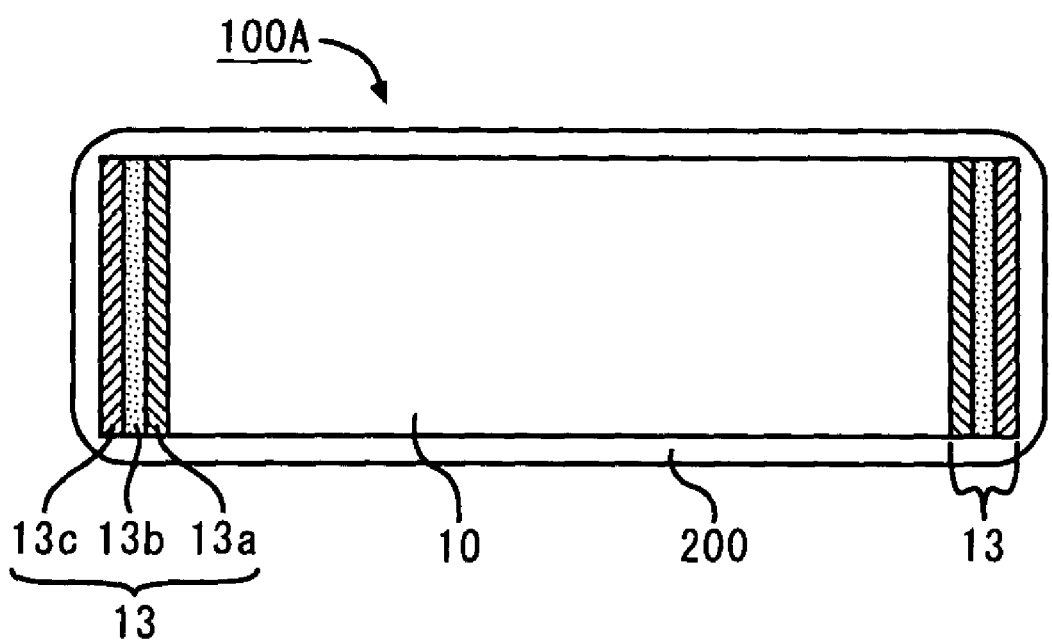
FIG. 1 is a schematic section view of an optical semiconductor device in accordance with a first embodiment of the present invention.

DESCRIPTION OF THE PREFERRED EMBODIMENTS (Principles of the Invention)

In a conventional optical multilayer film having a double-layer structure, only one reflective plane exists. On this reflective plane, interference can be caused only with light reflected by a reflective plane formed by the refractive index difference with the outside (such as the air). If two rays of light are to interfere with each other, the optical multilayer film having a double-layer structure is required to include a film having a thickness of ¼ wavelength, which is a length converted into an optical distance. Therefore, with a film thinner than that, desired functions of an optical multilayer film cannot be obtained.

On the other hand, an optical multilayer film of the present invention has a laminated structure that includes three or more layers, with reflective planes being formed therein. If interference is caused between any two of the reflective planes, the function as an optical multilayer film can be realized. Accordingly, each film can be made thinner than ¼ wavelength, which is a length converted into an optical distance. Thus, the stress controllability by virtue of titanium oxynitride can be improved.

To achieve such a structure, the present invention provides a laminated structure that includes a first layer, a third layer containing magnesium fluoride as a main component, and a second layer containing titanium oxynitride as a main component, the first layer having a different refractive index from that of the third layer or the second layer. In this laminated structure, two or more reflective planes are provided, and the thickness of the third layer is smaller than ¼ wavelength.

In general, an optical multilayer film is designed to obtain predetermined optical characteristics, such as a reflection preventing effect and a high reflection effect, utilizing multi-reflection and interference that are caused by a combination of materials having different refractive indices. Therefore, it is essential for the film included in the optical multilayer film to achieve a predetermined refractive index difference, and a combination of materials having a great difference in refractive index is normally required. In view of this, the inventors of the present invention directed their attention to the fact that magnesium fluoride has a low refractive index. If employed in an optical multilayer film, magnesium fluoride should cause a great refractive index difference with a material having a high refractive index. The inventors then considered employing magnesium fluoride in an optical multilayer film.

However, it is very undesirable that an optical multilayer film puts great stress onto an optical semiconductor. The inventors then found out that magnesium fluoride excel in the stress controllability even if the production conditions are adjusted. Therefore, the present invention provides a structure in which magnesium fluoride is combined with titanium oxynitride.

Titanium oxynitride excels in stress controllability, if the production conditions are properly adjusted. In the combination of titanium oxynitride and magnesium fluoride, the stress caused by magnesium fluoride that advantageously forms an optical film having a low refractive index can be controlled by titanium oxynitride. Thus, an optical multilayer film with reduced stress can be expected.

If an optical multilayer film has a double-layer structure made of titanium oxynitride and magnesium fluoride, however, the stress cannot be reduced to a desired level. This is because such an optical multilayer film cannot exhibit the desired optical effects due to the interference of rays of reflected light between planes having different refractive indices. The optical multilayer film having a double-layer structure includes only one reflective plane, and therefore, a thickness of ¼ wavelength or greater is required to cause interference. With a thickness smaller than that, it is difficult to cause interference. In other words, in the double-layer structure including a titanium oxynitride layer and a magnesium fluoride layer, the thickness of each layer cannot be reduced. Although excellent stress controllability is obtained through the use of titanium oxynitride, the stress caused by the layer of magnesium fluoride cannot be controlled freely.

To solve this problem, another layer is added to the structure containing titanium oxynitride and magnesium fluoride, and two or more reflective planes are formed within the structure. With this structure having two or more reflective planes within an optical multilayer film, interference can be caused between any two of the reflective planes. Even if each layer has a thickness of ¼ wavelength that is a length converted into an optical distance, interference can be caused by virtue of the design of the structure.

The layer of magnesium fluoride and the layer of titanium oxynitride may be directly connected with each other or another layer may be interposed therebetween. Individual stress caused in the optical multilayer film may be suppressed as a whole.

In the following, embodiments of the present invention will be described in detail, with reference to the accompanying drawings. It should be noted that, in the following description, "titanium oxynitride" and "magnesium fluoride" are not limited to the respective elements but may contain a very small amount of other elements, as long as the optical characteristics and stress remain the same.

First Embodiment

The following is a detailed description of a first embodiment of the present invention, with reference to the accompanying drawings. FIG. 1 is a schematic section view of an optical semiconductor device 100A in accordance with this embodiment. The section view of FIG. 1 is taken along the optical axis of a semiconductor chip 10.

As shown in FIG. 1, in this embodiment, an optical multilayer film 13 that has a multilayer structure is provided at one end or either end of the semiconductor chip 10. The end of the semiconductor chip 10 may be a light incident plane and light emission plane. Each optical multilayer film 13 has a three-layer structure that includes a first layer 13a in contact with the semiconductor chip 10, a second layer 13b, and a third layer 13c located in the outermost position among the three layers. The three-layer structure is designed to exhibit excellent transmission characteristics whether or not sealed with resin 200. In other words, each optical multilayer film 13 of this embodiment functions as a reflection preventing film for the air (or a vacuum) and the resin 200. The seal with the resin 200 is to protect the optical multilayer films 13 and the semiconductor chip 10 from being damaged at the time of shipping or operating, and is an inexpensive and easy technique of effectively securing a good performance of the optical semiconductor device 100A.

The reflection preventing film effective for both the air and the resin is produced by roughly deciding the conditions of the outermost third layer 13c based on the refractive index of the resin 200, forming the multilayer film including the first layer 13a and the second layer 13b so as to function as a reflection preventing film, and lastly forming the third layer 13c under the conditions decided in advance so that the optical multilayer film 13 can function as a reflection preventing film with respect to the refractive index of the air (or a vacuum). In this embodiment, the resin 200 may be epoxy resin, for example.

If the optical multilayer film 13 is produced by the above method, the second layer 13b has the highest refractive index, and the first layer 13a and the third layer 13c each has a lower refractive index than that of the second layer 13b.

Formed through the above procedures, the optical multilayer film 13 can function as a reflection preventing film both when the characteristics (the performance) of the optical semiconductor device 100A is evaluated and when the optical semiconductor device 100A is actually used. As a result, the optical characteristics of the optical semiconductor device 100A in actual use are substantially the same as the desired optical characteristics.

Figure 2A:
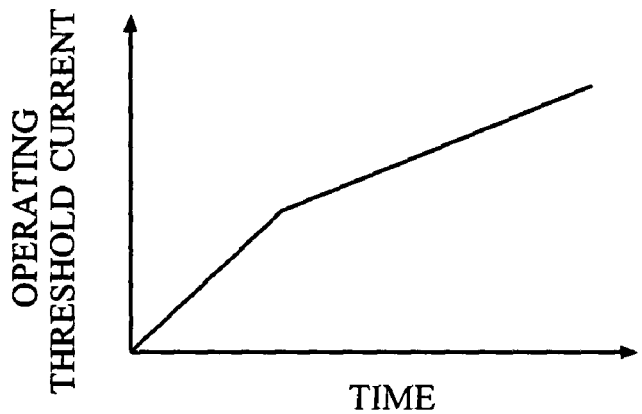
FIG. 2A is a graph showing a change with time in the operating threshold current of an optical semiconductor device having an optical multilayer film that causes stress.
Figure 2B:
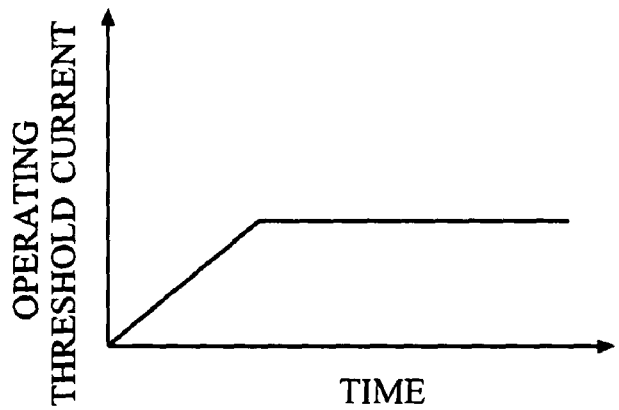
FIG. 2B is a graph showing a change with time in the operating threshold current of an optical semiconductor device having an optical multilayer film that does not cause stress.

The inventors of the present invention found that, with an optical multilayer film formed by stacking layers that cause different levels of stress, the optical characteristics of the optical semiconductor device deteriorate with time, because stress is caused in the semiconductor chip. FIGS. 2A and 2B prove this, showing that the operating threshold current of each optical semiconductor device (the lowest current possible for the optical semiconductor device to operate) increases with time. Each of the structures used in the experiments shown in FIGS. 2A and 2B was obtained by performing screening on a semiconductor device that included the first layer (the layer in contact with the semiconductor chip) that was an MgF film having a film thickness of 57.0 nm and a refractive index of 1.37, the third layer (the outermost layer) that was an MgF film having a film thickness of 100.0 nm and a refractive index of 1.37, and the second layer (the layer interposed between the first layer and the third layer) that was a TiO film having a film thickness of 100.0 nm and a refractive index of 2.27. FIG. 2A shows the measurement results of a situation in which a film was provided so that stress (compressive stress) was caused, while FIG. 2B shows the measurement results a situation in which a film was provided so that no stress (or only small stress) was caused. As is apparent from FIGS. 2A and 2B, the characteristics (the threshold value) cannot be easily stabilized by screening, where stress is caused.

Therefore, the optical multilayer film 13 of this embodiment has a structure formed by stacking layers that cause stresses of opposite properties. More specifically, this embodiment utilizes both tensile stress and compressive stress that cancel each other in the multilayer film, thereby preventing the semiconductor chip 10 from having stress inside. For example, the second layer 13b for adjusting stress is provided between the first layer 13a and the third layer 13c, so that either end face (on which the optical multilayer film 13 is formed) of the semiconductor chip 10 is protected from stress. Referring back to FIG. 1, the first layer 13a and the third layer 13c are each made of a material that causes compressive stress, and the second layer 13b is made of a material that causes tensile stress. In the following, the optical semiconductor device 100A of this embodiment will be described in greater detail, with reference to the accompanying drawings.

Figure 3:
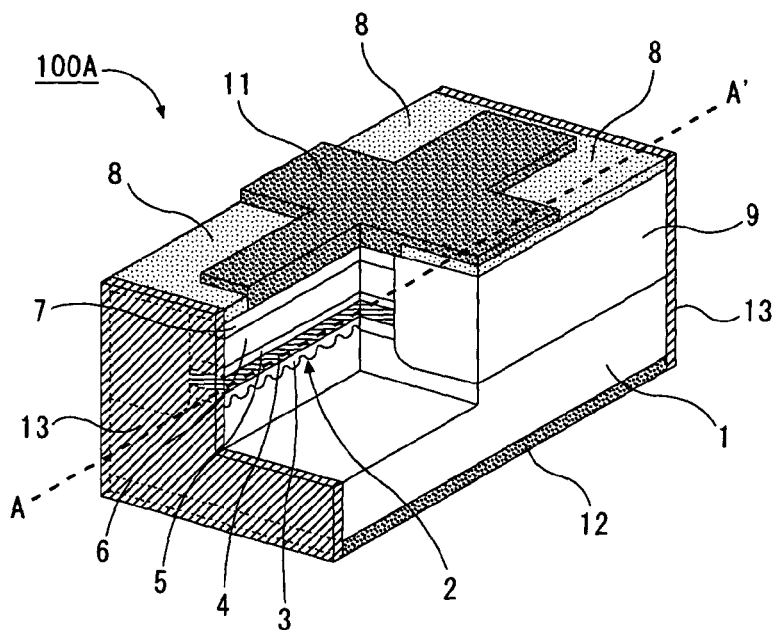
FIG. 3 is a perspective view of the optical semiconductor device in accordance with the first embodiment of the present invention.
Figure 4:
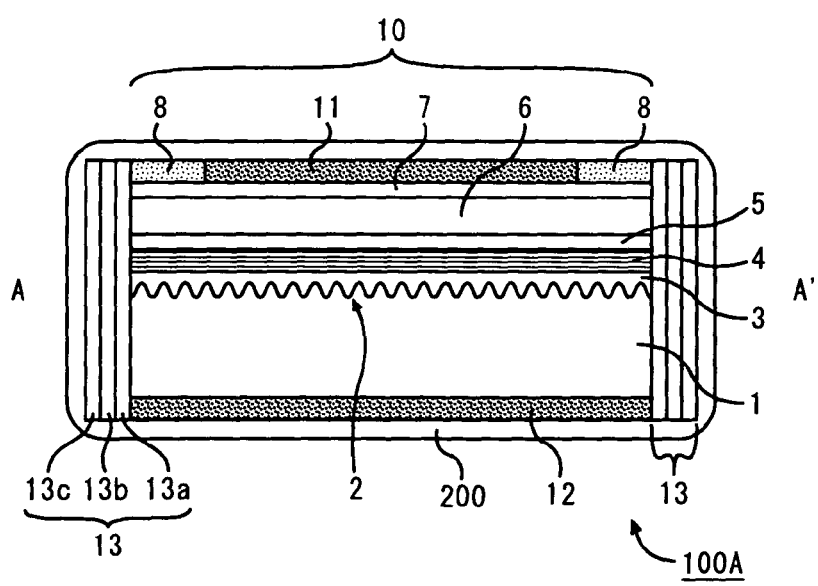
FIG. 4 is a section view of the optical semiconductor device, taken along the line A-A' of FIG. 3.

FIG. 3 is a perspective view of the optical semiconductor device 100A of this embodiment. FIG. 4 is a section view of the optical semiconductor device 100A, taken along the line A-A' of FIG. 3. In this embodiment, a distributed feedback laser (DFB laser) is employed as the optical semiconductor device 100A.

The optical semiconductor device 100A includes the semiconductor chip 10 and optical multilayer films 13. The semiconductor chip 10 has a mesa-like structure, as shown in FIGS. 3 and 4. More specifically, a diffraction grating 2 is formed on a semiconductor substrate 1. An n-type cladding layer 3, an active layer 4, a p-type cladding layer 5, a p-type layer 6, and a contact layer 7, are stacked on the diffraction grating 2. The active layer 4 is formed of a MQW (Multi-Quantum Well), for example. Outside the mesa-like structure, a semi-insulating embedded hetero region 9 is formed.

An upper electrode 11 and a lower electrode 12 are provided at the top and the bottom of this layer structure. A cap layer 8 is then formed in the area on the contact layer 7 in which the upper electrode 11 does not exist.

The above structure can be formed by techniques such as selective epitaxial growth on the semiconductor substrate 1, selective etching, mesa embedding growth, substrate polishing, electrode film deposition, patterning, and cleavage.

The optical multilayer film 13 that functions as a reflection preventing film is formed at either end of the semiconductor chip 10 having the above structure. Each of the optical multilayer films 13 has a three-layer structure that includes the first layer 13a, the second layer 13b, and the third layer 13c. The second layer 13b is made of a material that causes a different type of stress from that of the first and third layers 13a and 13c that sandwich the second layer 13b. In short, each of the optical multilayer films 13 has a crystalline structure that has airtightness by virtue of the materials and the production method employed. Between each film and its neighboring material in this structure, stresses are cancelled by each other. With such a structure, each end face of the semiconductor chip 10 is protected from stress, and stable optical characteristics can be obtained.

In each optical multilayer film 13, the second layer 13b, which is located in the middle, is made of titanium oxynitride (TiON), for example. Titanium oxide nitride (TiON) is a material that causes tensile stress. Accordingly, the first layer 13a and the third layer 13c, which sandwich the second layer 13b, are made of such a material that causes compressive stress, which is of the opposite property from that of the second layer 13b. Examples of such materials include magnesium fluoride (MgF) and silicon fluoride (SiF). In this embodiment, the composition ratio of each material is not specified.

Each layer in each optical multilayer film 13 is designed to function as a reflection preventing layer under the respective conditions, as described above. In the following, the method of producing the optical semiconductor device 100A, as well as the design procedures, will be described in detail, with reference to the accompanying drawings. In this embodiment, however, the semiconductor chip 10 is not limited to a DFB laser, and any optical semiconductor element may be employed. Therefore, the method of preparing the semiconductor chip 10 will be omitted from the following description.

Figure 5A:
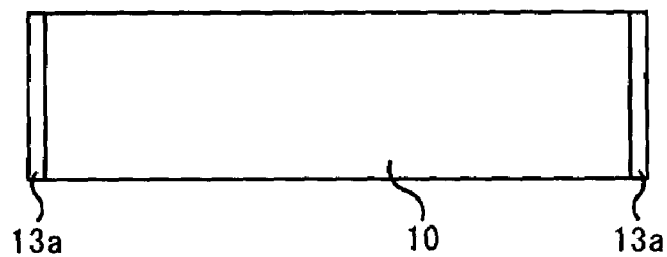
FIGS. 5A through 5C are section views illustrating the process of producing the optical semiconductor device in accordance with the first embodiment of the present invention.
Figure 5B:
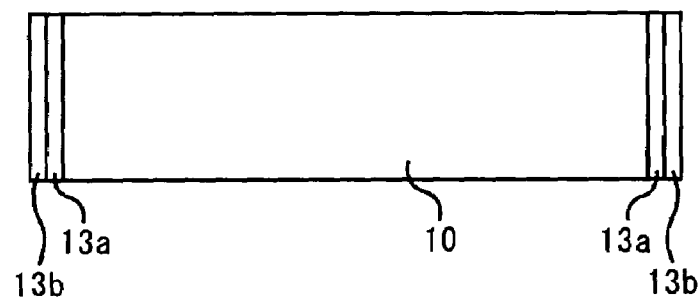
Figure 5C:
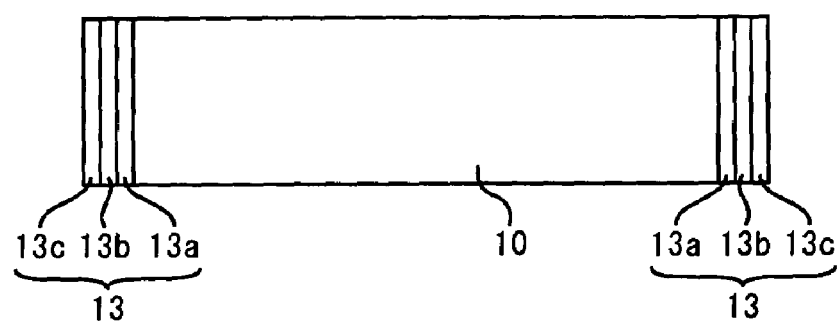

FIGS. 5A through 5C are section views illustrating the process of producing the optical semiconductor device 100A of this embodiment. The section views of FIGS. 5A through 5C are also taken along the line A-A' of FIG. 3.

First, based on the refractive index of the resin 200 to seal a completed optical semiconductor device 100A, the conditions (such as the material, the film thickness, and the film forming method) for the third layer 13c are roughly determined. More specifically, the conditions for the third layer 13c are roughly determined on the assumption that the third layer 13c should have such a film thickness that light reflected by the plane outside the third layer 13c (the opposite side from the semiconductor chip 10) is damped (or canceled) by light propagating inside the third layer 13c.

The first layer 13a and the second layer 13b are then designed so that a multilayer film consisting of the first layer 13a and the second layer 13b can function as a reflection preventing film for the resin 200. This step is carried out by determining the materials, the film thicknesses, and the film forming method for the first layer 13a and the second layer 13b, based on the refractive index of the resin 200.

The third layer 13c is then designed so that the optical multilayer film 13 consisting of the first layer 13a, the second layer 13b, and the third layer 13c, can function as a reflection preventing film in an environment (in the air or a vacuum) at the time of characteristics evaluation. This step is carried out in accordance with the conditions determined above and the compositions of the first layer 13a and the second layer 13b.

After determining the composition of the optical multilayer film 13, the optical multilayer film 13 is actually formed on the semiconductor chip 10. In this step, the first layer 13a is first formed on either end face of the semiconductor chip 10, as shown in FIG. 5A, by a known technique such as a deposition technique or an epitaxial growth technique. In this embodiment, the first layer 13a is an MgF film having a film thickness of 62.0 nm. Also, the first layer 13a has a refractive index of 1.37.

Figure 6:
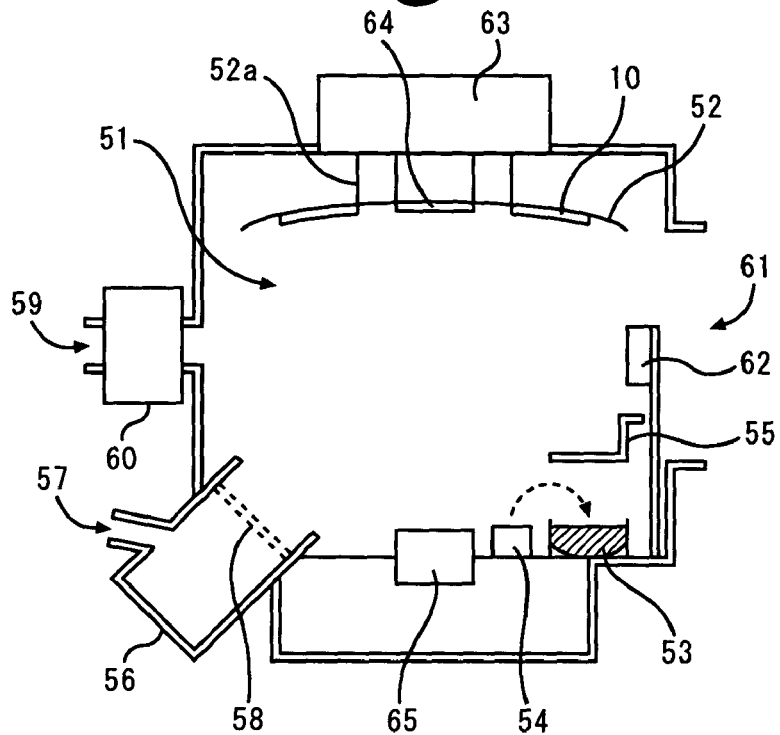
FIG. 6 illustrates the structure of ion-assisted deposition equipment that is used to form second layers in the production process illustrated in FIGS. 5A through 5C.

The second layer 13b is then formed on each first layer 13a, as shown in FIG. 5B. In view of the stress and the adsorption to the first layer 13a, each second layer 13b is formed by an ion-assisted deposition technique. FIG. 6 illustrates equipment for the ion-assisted deposition. In this embodiment, each second layer 13b is a TiON film having a film thickness of 70.0 nm and a refractive index of 2.48.

As shown in FIG. 6, the ion-assisted deposition equipment has a rotational dome 52 rotatably attached to the upper side of a deposition chamber 51 with a rotational unit 52a. A cartridge-type hearth 53 for accommodating raw materials is provided at a bottom corner of the deposition chamber 51. The hearth 53 faces the substrate mounting face of the rotational dome 52. An electronic gun 54 is further provided to irradiate the raw materials in the cartridge-type hearth 53 with electrons.

A Kauffman ion gun 56 (80 mm in diameter, 1100 mm from the dome center) is further provided at another bottom corner of the deposition chamber 51. The Kauffman ion gun 56 also faces the substrate mounting face of the rotational dome 52. This ion gun 56 ionizes gases introduced through an ionizing gas inlet 57 with thermal electrons emitted from the filament provided therein. The ion gun 56 then emits the ionized gases toward the rotational dome 52 with assistance of applied voltage of an ion accelerating electrode 58.

There is another gas inlet 59 provided on a side wall of the deposition chamber 51. This gas inlet 59 is located in an area between the ion gun 56 and the rotational dome 52. Gases to be introduced through the gas inlet 59 are subjected to flow rate adjustment by an automatic pressure adjuster 60. An exhaust outlet 61 is also formed on the side wall opposite from the gas inlet 59. A crystal vibrator deposition rate monitor 62 is provided in the vicinity of the exhaust outlet 61.

A first photoelectric film thickness monitor 63 to monitor film thicknesses based on reflected light is provided above the center of the rotational dome 52. This first photoelectric film thickness monitor 63 monitors the thickness of each film formed on the surface of a monitor glass board 64 that is located in the center of the rotational dome 52. Further, a second photoelectric film thickness monitor 65 is provided between the ion gun 56 and the electronic gun 54. The second photoelectric film thickness monitor 65 is located on the opposite side from the first photoelectric film thickness monitor 63. The second photoelectric film thickness monitor 65 measures the thickness of each film formed on the surface of the monitor glass board 64, based on transmission light.

When a TiON film is to be formed by the above ion-assisted deposition equipment, the semiconductor chip 10 having the first layers 13a already formed thereon is first placed on the lower face of the rotational dome 52 surrounding the monitor glass board 64. The cartridge-type hearth 53 filled with $Ti_3O_5$ as the raw material is placed in the deposition chamber 51. The gas in the deposition chamber 51 is then discharged through the exhaust outlet 61. An oxygen ($O_2$) gas is supplied into the ion gun 56 through the ionizing gas inlet 57. A voltage of 1 kV is then applied to the ion accelerating electrode 58, and an ion current of 20 mA is supplied into the ion gun 56. By doing so, the oxygen is ionized and emitted into the deposition chamber 51.

A nitrogen ($N_2$) gas is also introduced into the deposition chamber 51 through the gas inlet 59. Here, the flow rate of the gas to be introduced through the gas inlet 59 is adjusted to a predetermined flow rate by the automatic pressure adjuster 60. Also, the magnetic field changes the directions of electron beams emitted from the electron gun 54 by 180 degree, so that the $Ti_3O_5$ in the cartridge-type hearth 53 is irradiated with the electron beams. The $Ti_3O_5$ in the cartridge-type hearth 53 is thereby vaporized, and is then emitted toward the lower face of the rotational dome 52 through a shutter 55 that is open.

At this point, a voltage of 6.0 kV is applied to the electrode in the electron gun 54. In this manner, the vaporized titanium oxide and ionized oxygen and nitrogen are supplied to the semiconductor chip 10 under the rotational dome 52 and the monitor glass board 64, so that a TiON film is formed at a deposition rate of 0.03 to 0.08 nm/s. The deposition rate can be controlled by changing the amount of current to be supplied to the electron gun 54.

The growth of the TiON film is monitored by the first photoelectric film thickness monitor 63 on the side of the rotational dome 52. The first photoelectric film thickness monitor 63 has a light source and a light detector. The first photoelectric film thickness monitor 63 measures the quantity of light that has been supplied from the light source and then reflected by the TiON film deposited on the surface of the monitor glass board 64, thereby detecting the thickness of the TiON film.

The thickness of the TiON film is also detected by the second photoelectric film thickness monitor 65. Further, part of the material vaporized in the cartridge-type hearth 53 is deposited on the crystal board in the crystal vibrator deposition rate monitor 62. Accordingly, the crystal vibrator deposition rate monitor 62 detects the deposition rate from changes of the frequency of vibrations of the crystal board. Those changes are caused with increases of the amount of deposition.

After each second layer 13b is formed in the above manner, the third layer 13c is formed on each second layer 13b, as shown in FIG. 5C. This film formation can be carried out by a deposition technique, an epitaxial growth technique, or the like. In this embodiment, each third layer 13c is an MgF film having a film thickness of 100.0 nm and a refractive index of 1.37.

Figure 7:
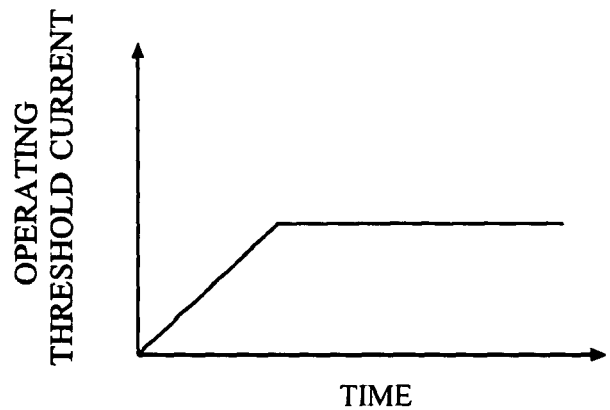
FIG. 7 is a graph showing a change with time in the operating threshold current of the optical semiconductor device in accordance with the first embodiment of the present invention.

FIG. 7 shows a change with time in the operating threshold current of the optical semiconductor device 100A designed and produced in the above described manner. As shown in FIG. 7, the operating threshold current of the optical semiconductor device 100A is stabilized with time. This proves that the structure of this embodiment prevents stress on either end face of the semiconductor chip 10, and stabilizes the optical characteristics of the optical semiconductor device 100A. Compared with the graph shown in FIG. 2A, the advantages of this embodiment become more obvious.

As described so far, this embodiment provides the optical multilayer films 13 that function as reflection preventing films having the same effects in practice as the effects estimated at the time of characteristics (performance) evaluation. With the optical multilayer films 13, the optical semiconductor device 100A can have the same optical characteristics in practice as the optical characteristics expected at the time of designing. Further, with compressive stress and tensile stress coexisting, the semiconductor chip 10 is protected from stress, and the characteristics of the optical semiconductor device 100A are thereby stabilized. This effect becomes more prominent when the optical semiconductor device 100A is sealed with the resin 200.

In this embodiment, the semiconductor chip 10 is not necessarily a DFB laser, but may be some other type of optical semiconductor device, such as a Fabry-Perot laser, a surface-emitting laser, a light emitting diode, or an optical modulator.

Second Embodiment

Figure 8:
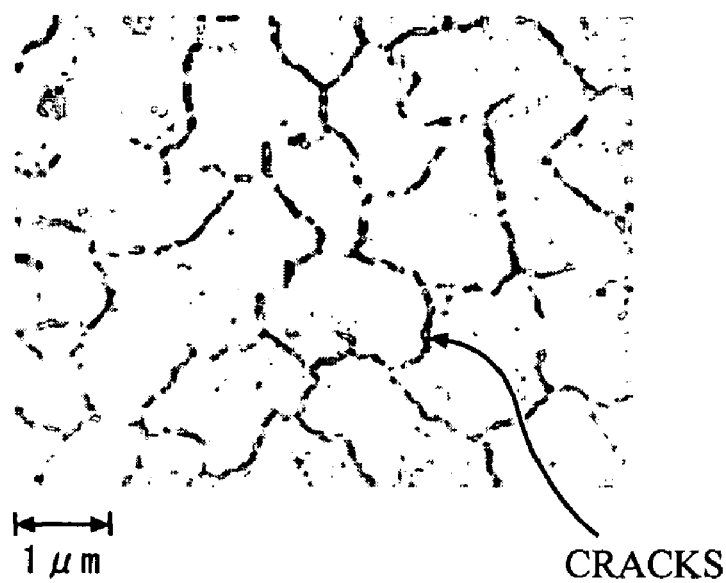
FIG. 8 illustrates cracks caused in a first layer in a case where the first layer is made of magnesium fluoride and the second layer is made of titanium oxynitride.

A second embodiment of the present invention will be next described in detail, with reference to FIG. 8. In the first embodiment, each first layer 13a in contact with the semiconductor chip 10 is an MgF layer. However, the inventors of the present invention found that, when an MgF film is employed for each first layer 13a, cracks of 1 μm in length might appear in the MgF film (each first layer 13a), as shown in FIG. 8.

To avoid such a problem, each first layer 13a is made of silicon oxide (SiO) in this embodiment. By doing so, each optical multilayer film 13 can avoid cracks, and the optical characteristics of the optical semiconductor device 100A can be stabilized.

The formation of each first layer 13a using SiO may be carried out by a deposition technique, an epitaxial growth technique, or the like. In this embodiment, each first layer 13a is a SiO film having a film thickness of 50.0 μm and a refractive index of 1.45.

With this structure, this embodiment has the effect of preventing cracks in each first layer 13a, as well as the same effects as those of the first embodiment. Thus, the optical characteristics of the optical semiconductor device 100A can be further stabilized. The other parts of the structure of this embodiment are the same as those of the first embodiment, and therefore, explanation of them is omitted herein.

Third Embodiment

Figure 9:
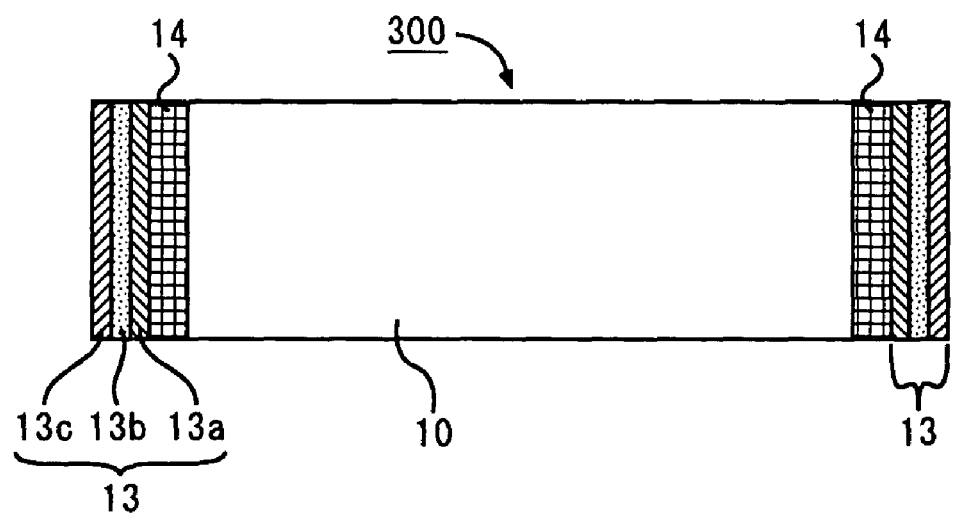
FIG. 9 is a section view of an optical semiconductor device in accordance with a third embodiment of the present invention.

A third embodiment of the present invention will be next described in detail, with reference to FIG. 9. In the first embodiment, each optical multilayer film 13 having a three-layer structure functions as a reflection preventing film. On the other hand, this embodiment has another layer added to the three-layer structure so as to form a reflection film or a semi-transmission film.

FIG. 9 is a schematic section view of an optical semiconductor device 300 of this embodiment. The section view of FIG. 9 is taken along the optical axis of the semiconductor chip 10.

As is apparent from FIG. 9, the optical semiconductor device 300 has a fourth layer 14 on one end face or either end face of the semiconductor chip 10 that is the same as that of the first embodiment. An optical multilayer film 13 that is the same as that of the first embodiment is formed on each fourth layer 14. The fourth layer 14 is designed to have a higher refractive index than that of the first layer 13a of each optical multilayer film 13. In this manner, the fourth layer 14 having a higher refractive index than that of the first layer 13a is provided between each optical multilayer film 13 and the semiconductor chip 10, so that each entire optical multilayer film including the fourth layer 14 can function as a reflective film. The other parts of the structure of this embodiment are the same as those of the first embodiment, and therefore, explanation of them is omitted herein.

According to an aspect of the present invention, stress in the magnesium fluoride film that is useful as a low-refractive-index optical film can by controlled by titanium oxynitride having good stress controllability, so that stress-reduced optical multilayer film and semiconductor devices using the same can be produced. According to another aspect of the present invention, a multilayer structure having at least three layers is employed so that multiple reflection planes can be defined in the optical multilayer film. It is therefore possible to make interference with the reflected light even when the first layer that has a relatively high refractive index is designed so as to have a thickness less than an optical length equal to the ¼ wavelength.

According to yet another aspect of the present invention, it is possible to reduce variation in the optical characteristics caused between a case where the outermost layer of the optical multilayer film is exposed to gas and another case where the outermost film is covered with resin similar in nature to the outermost film. More particularly, the resin that covers the outermost layer may be approached so as to have an optical nature similar to that of the outermost layer. It is therefore possible to design the optical multilayer film so that the optical multilayer film can exhibit first optical characteristics that are obtained by causing a refractive index difference between an outermost layer and the air or an inert gas, and second optical characteristics that are obtained by not causing a refractive index difference between the outermost layer and a material existing on the external side of the outermost layer. This makes it possible to prevent variation in the optical characteristics that may be caused before and after resin is provided for packaging. It is therefore possible to obtain the desired characteristics irrespective of whether the device is practically used in any of the above-mentioned two cases.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present invention is based on Japanese Patent Application No. 2002-255056, the entire disclosure of which is hereby incorporated by reference.

What is claimed is:

1. An optical semiconductor device comprising
an optical multilayer film that is located on a light emitting plane of an optical semiconductor chip,
the optical multilayer film having a laminated structure that at least includes a first layer, a second layer containing titanium oxynitride as a main component, and a third layer containing magnesium fluoride as a main component, the first layer having a different refractive index from that of the second layer or the third layer, the third layer being most removed from the light emitting plane, the laminated structure having a plurality of reflection planes, the thickness of the third layer being less than ¼ of the wavelength of light emitting from the light emitting plane converted into an optical distance, and tensile stresses and compressive stresses of the first, second, and third layers substantially canceling each other.

2. The optical semiconductor device as claimed in claim 1, wherein the first layer and the second layer are in contact with each other.

3. The optical semiconductor device as claimed in claim 1, wherein another layer is interposed between the first layer and the second layer.

4. The optical semiconductor device as claimed in claim 1, wherein: the first layer contains magnesium fluoride; and the second layer is sandwiched by the first layer and the third layer.

5. The optical semiconductor device as claimed in claim 1, wherein the first layer contains silicon oxide as a main component.

6. The optical semiconductor device as claimed in claim 1, wherein the optical multilayer film is a reflection preventing film or a highly reflective film.

7. The optical semiconductor device as claimed in claim 1, wherein the second layer is a layer formed by ion-assisted deposition.

8. The optical semiconductor device as claimed in claim 1, wherein at least the light emitting plane is sealed with resin.

9. The optical semiconductor device as claimed in claim 1, further comprising a fourth layer having a refractive index higher than that of the first layer.

* * * * *